United States Patent
Lee et al.

(10) Patent No.: US 11,894,506 B2
(45) Date of Patent: Feb. 6, 2024

(54) DISPLAY APPARATUS HAVING A PAD SPACED AWAY FROM AN ENCAPSULATING ELEMENT AND A BLACK MATRIX ON THE ENCAPSULATING ELEMENT

(71) Applicant: LG Display Co., Ltd., Seoul (KR)

(72) Inventors: Sun-Mi Lee, Seoul (KR); Chang-Hoon Oh, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 101 days.

(21) Appl. No.: 17/119,284

(22) Filed: Dec. 11, 2020

(65) Prior Publication Data

US 2021/0202812 A1 Jul. 1, 2021

(30) Foreign Application Priority Data

Dec. 31, 2019 (KR) .................... 10-2019-0180181

(51) Int. Cl.
| | |
|---|---|
| *H01L 33/62* | (2010.01) |
| *H01L 33/54* | (2010.01) |
| *H01L 27/15* | (2006.01) |
| *H01L 33/58* | (2010.01) |
| *H01L 33/38* | (2010.01) |
| *H01L 33/40* | (2010.01) |
| *G06F 3/041* | (2006.01) |

(52) U.S. Cl.
CPC ............ *H01L 33/62* (2013.01); *G06F 3/0412* (2013.01); *H01L 27/156* (2013.01); *H01L 33/38* (2013.01); *H01L 33/40* (2013.01); *H01L 33/54* (2013.01); *H01L 33/58* (2013.01)

(58) Field of Classification Search
CPC ......... H01L 33/62; H01L 33/38; H01L 33/40; H01L 33/54; H01L 33/58; H01L 27/153; H01L 27/156; G06F 3/0412

See application file for complete search history.

(56) References Cited

U.S. PATENT DOCUMENTS

| | | | |
|---|---|---|---|
| 2016/0013436 A1* | 1/2016 | Im | H01L 27/3276 |
| | | | 257/40 |
| 2018/0331160 A1* | 11/2018 | Beak | H10K 50/844 |
| 2018/0348929 A1* | 12/2018 | Rhe | G06F 3/047 |
| 2019/0206330 A1* | 7/2019 | Kim | G09G 3/3283 |
| 2019/0280053 A1* | 9/2019 | Oh | H01L 51/56 |
| 2019/0326360 A1* | 10/2019 | Gwon | G06F 3/0412 |

FOREIGN PATENT DOCUMENTS

| | | |
|---|---|---|
| KR | 10-2015-0063220 A | 6/2015 |
| KR | 10-2016-0007407 A | 1/2016 |
| KR | 10-2016-0033571 A | 3/2016 |

(Continued)

*Primary Examiner* — Shaun M Campbell
(74) *Attorney, Agent, or Firm* — Birch, Stewart, Kolasch & Birch, LLP

(57) ABSTRACT

A display apparatus is provided. The display apparatus includes a pad spaced away from an encapsulating element. The pad can have a stacked structure of a pad electrode layer and a pad cover layer. A side surface of the pad electrode layer can be covered by the pad cover layer. Thus, in the display apparatus, damage of the pad electrode layer due to a subsequent process can be prevented and as such, the reliability of an external signal transmitted through the pad can be improved.

19 Claims, 8 Drawing Sheets

(56) References Cited

FOREIGN PATENT DOCUMENTS

| KR | 10-2018-0025022 A | 3/2018 |
|----|-------------------|--------|
| KR | 10-2018-0025382 A | 3/2018 |
| KR | 10-2018-0070218 A | 6/2018 |
| KR | 10-2018-0124607 A | 11/2018 |
| KR | 10-2018-0124613 A | 11/2018 |
| KR | 10-2019-0023866 A | 3/2019 |
| KR | 10-2019-0076384 A | 7/2019 |

\* cited by examiner

DISPLAY APPARATUS HAVING A PAD SPACED AWAY FROM AN ENCAPSULATING ELEMENT AND A BLACK MATRIX ON THE ENCAPSULATING ELEMENT

CROSS-REFERENCE TO RELATED APPLICATIONS

This application claims the priority benefit of Korean Patent Application No. 10-2019-0180181, filed in the Republic of Korea on Dec. 31, 2019, the entire contents of which are hereby expressly incorporated by reference as if fully set forth herein into the present application.

BACKGROUND OF THE INVENTION

Field of the Invention

The present invention relates to a display apparatus including a pad spaced away from an encapsulating element and a black matrix on the encapsulating element.

Discussion of the Related Art

Generally, an electronic appliance, such as a monitor, a TV, a laptop computer and a digital camera, includes a display apparatus to realize an image. For example, the display apparatus can include a light-emitting device. The light-emitting device can emit light displaying a specific color. For example, the light-emitting device can include a light-emitting layer between a first emission electrode and a second emission electrode.

The display apparatus can further include an encapsulating element covering the light-emitting device to prevent damage of the light-emitting device due to external impact and moisture. The display apparatus can include a pad for receiving a signal from an outside. The pad can be disposed outside the encapsulating element. A black matrix and/or color filters can be formed on the encapsulating element. A process of forming the black matrix and/or the color filters can include an etching process. Thus, in the display apparatus, the pad can be damaged by the process of forming the black matrix and/or the color filters.

SUMMARY OF THE INVENTION

Accordingly, the present invention is directed to a display apparatus that substantially obviates one or more problems due to limitations and disadvantages of the related art.

An object of the present invention is to provide a display apparatus capable of preventing the damage of a pad due to an etching process which is performed after the formation of the pad.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, there is provided an improved display apparatus comprising a device substrate. The device substrate includes a display area and a non-display area. A light-emitting device is disposed on the display area of the device substrate. A pad is disposed on the non-display area of the device substrate. The pad has a structure in which a pad electrode layer and a pad cover layer are stacked. The pad is spaced away from an encapsulating element covering the light-emitting device. The pad cover layer extends on a side surface of the pad electrode layer.

A black matrix can be disposed on the encapsulating element. The pad cover layer can have an etch selectivity with the black matrix.

Color filters can be disposed on the encapsulating element. The pad cover layer can have an etch selectivity with the color filters.

The pad cover layer can include titanium (Ti).

A thin film transistor can be disposed between the display area of the device substrate and the light-emitting device. A source electrode of the thin film transistor can be covered by a first electrode cover layer. A drain electrode of the thin film transistor can be covered by a second electrode cover layer.

The first electrode cover layer can extend on a side surface of the source electrode. The second electrode cover layer can extend on a side surface of the drain electrode.

The second electrode cover layer can include the same material as the first electrode cover layer.

The first electrode cover layer can include the same material as the pad cover layer.

The pad electrode layer can include the same material as the source electrode and the drain electrode.

The pad electrode layer can have a multi-layer structure.

A touch buffer layer can be disposed on the encapsulating element. A touch structure can be disposed on the touch buffer layer. The touch structure can be electrically connected to the pad by a touch routing line. The touch routing line can include a routing electrode layer and a routing cover layer. The routing cover layer can be disposed on the routing electrode layer.

The routing cover layer can extend on a side surface of the routing electrode layer.

The routing cover layer can include the same material as the pad cover layer.

The pad electrode layer can include the same material as the routing electrode layer.

A bending area can be disposed within the non-display area of the device substrate. A connecting line can intersect the bending area. A crack preventing layer can be disposed on the connecting line. The crack preventing layer can overlap the bending area. The touch routing line can be connected to the pad by the connecting line. Each of the touch routing line and the pad can include an end on the crack preventing layer.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
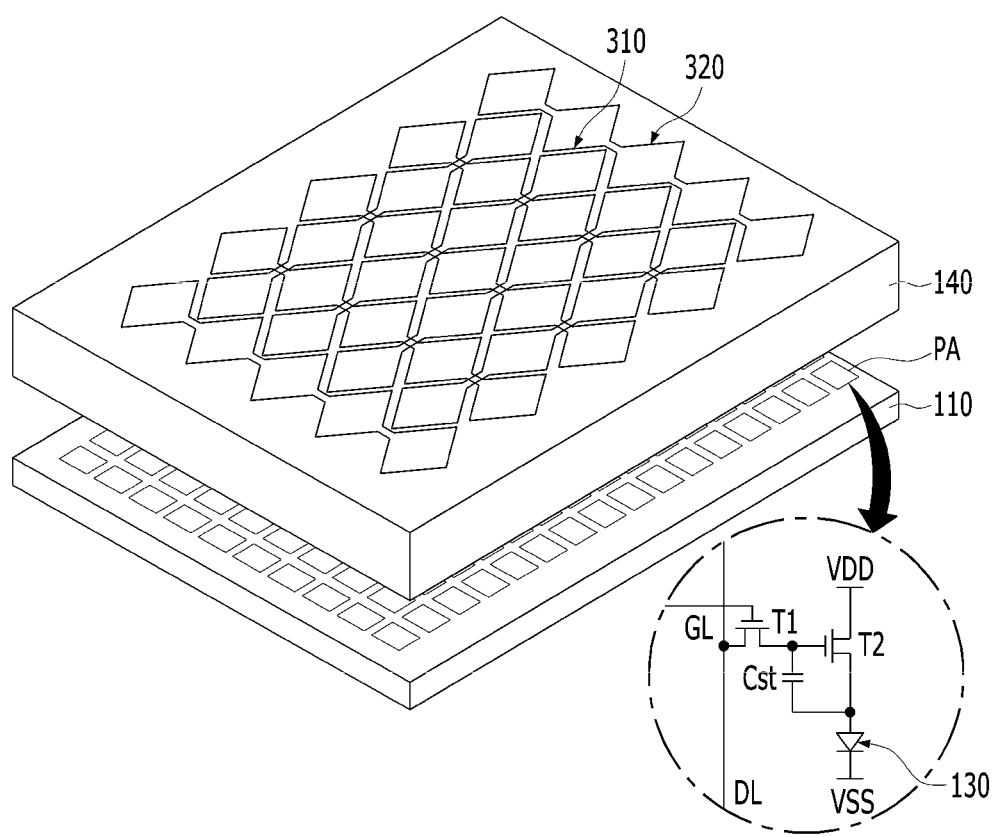
FIG. 1 is a view schematically showing a display apparatus according to an embodiment of the present invention.

Hereinafter, details related to the above objects, technical configurations, and operational effects of the embodiments of the present invention will be clearly understood by the following detailed description with reference to the drawings, which illustrate some embodiments of the present invention. Here, the embodiments of the present invention are provided in order to allow the technical sprit of the present invention to be satisfactorily transferred to those skilled in the art, and thus the present invention can be embodied in other forms and is not limited to the embodiments described below.

In addition, the same or extremely similar elements can be designated by the same reference numerals throughout the specification, and in the drawings, the lengths and thickness of layers and regions can be exaggerated for convenience. It will be understood that, when a first element is referred to as being "on" a second element, although the first element can be disposed on the second element so as to come into contact with the second element, a third element can be interposed between the first element and the second element.

Here, terms such as, for example, "first" and "second" can be used to distinguish any one element with another element and may not define any order. However, the first element and the second element can be arbitrary named according to the convenience of those skilled in the art without departing the technical sprit of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiments

Figure 2:
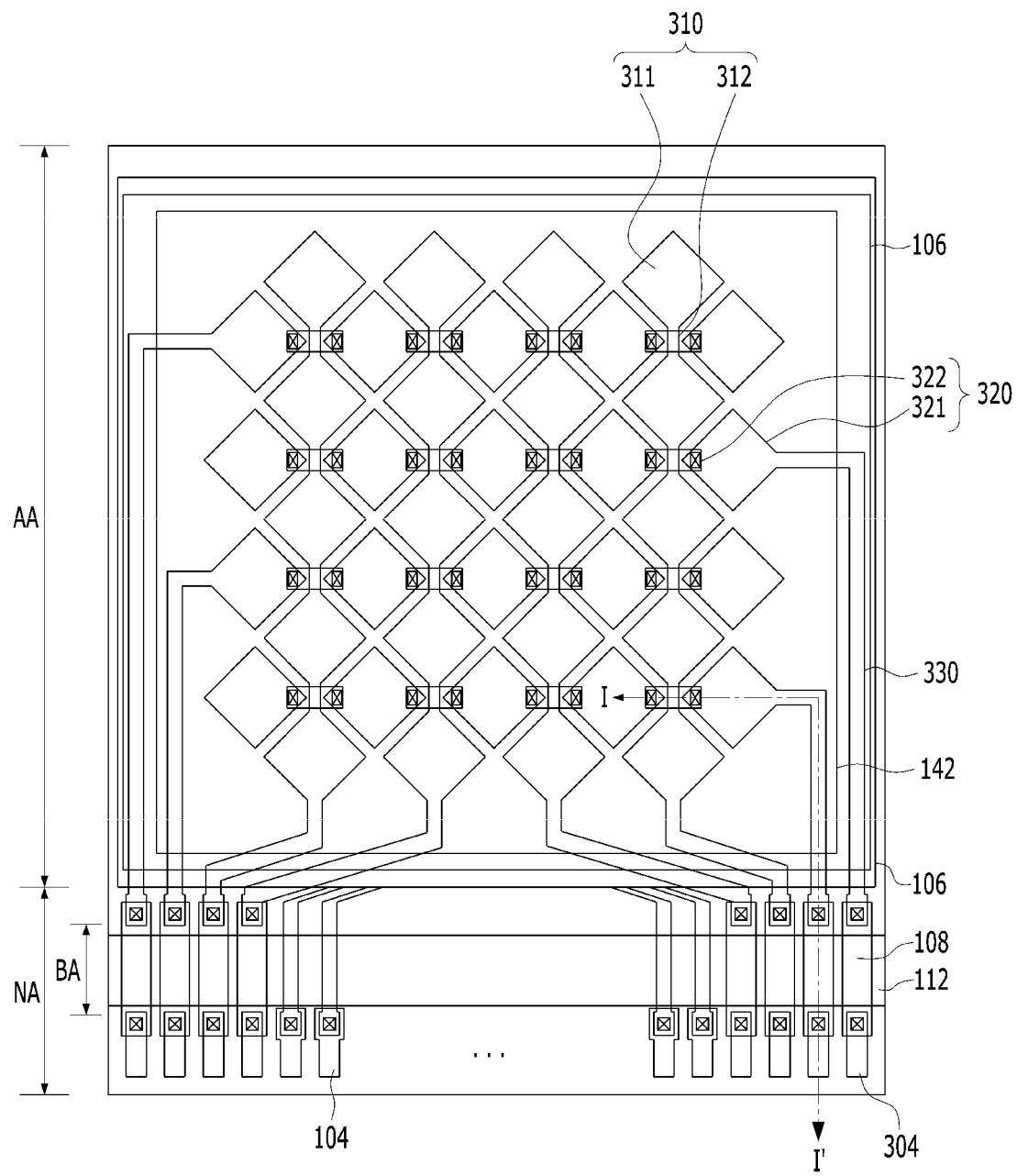
FIG. 2 is a view showing a top surface of the display apparatus according to the embodiment of the present invention.
Figure 3:
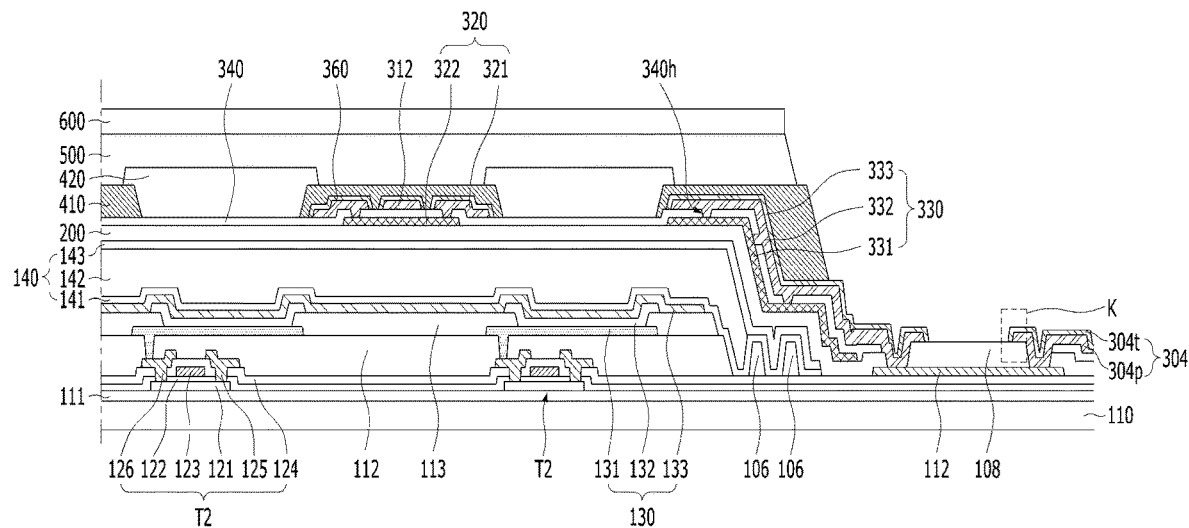
FIG. 3 is a view taken along line I-I' of FIG. 2.

FIG. 1 is a view schematically showing a display apparatus according to an embodiment of the present invention. FIG. 2 is a view showing a top surface of the display apparatus according to the embodiment of the present invention. FIG. 3 is a view taken along line I-I' of FIG. 2. All the components of the display apparatus according to all embodiments of the present invention are operatively coupled and configured.

Referring to FIGS. 1 to 3, the display apparatus according to the embodiment of the present invention can include a device substrate 110. The device substrate 110 can include an insulating material. For example, the device substrate 110 can include glass or plastic.

The device substrate 110 can include a display area AA and a non-display area NA. Signal lines GL, DL and VDD can be disposed on the display area AA of the device substrate 110. For example, the signal lines GL, DL and VDD can include a gate line GL transmitting a gate signal, a data line DL transmitting a data signal, and a power supply line VDD supplying a power voltage. The signal lines GL, DL and VDD can define pixel regions PA. For example, the display area AA of the device substrate 110 can include a plurality of the pixel regions PA defined by the signal lines GL, DL and VDD. Each of the pixel regions PA can emit light according to signals applied by the signal lines GL, DL and VDD. For example, a driving circuit and a light-emitting device 130 can be disposed in each pixel region PA.

The driving circuit can generate a driving current corresponding to the data signal according to the gate signal. For example, the driving circuit can include a first thin film transistor T1, a second thin film transistor T2 and a storage capacitor Cst. The first thin film transistor T1 can turn on and off the second thin film transistor T2 according to the gate signal. The second thin film transistor T2 can generate the driving current corresponding to the data signal. The storage capacitor Cst can maintain the operation of the second thin film transistor T2 for one frame.

The first thin film transistor T1 and the second thin film transistor T2 can have the same structure. For example, the second thin film transistor T2 can include a semiconductor pattern 121, a gate insulating layer 122, a gate electrode 123, an interlayer insulating layer 124, a source electrode 125 and a drain electrode 126.

The semiconductor pattern 121 can include a semiconductor material. For example, the semiconductor pattern 121 can include silicon. The semiconductor pattern 121 can be an oxide semiconductor. For example, the semiconductor pattern 121 can include a metal oxide, such as IGZO. The semiconductor pattern 121 can include a source region, a channel region and a drain region. The channel region can be disposed between the source region and the drain region. The source region and the drain region can have an electrical conductivity higher than the channel region.

The gate insulating layer 122 can be disposed on the semiconductor pattern 121. For example, the semiconductor pattern 121 can be disposed between the device substrate 110 and the gate insulating layer 122. The gate insulating layer 122 can extend beyond the semiconductor pattern 121. For example, a side surface of the semiconductor pattern 121 can be in direct contact with the gate insulating layer 122. The gate insulating layer 122 can include an insulating material. For example, the gate insulating layer 122 can include silicon oxide (SiO) and/or silicon nitride (SiN). The gate insulating layer 122 can include a material having a high dielectric constant. For example, the gate insulating layer 122 can include a High-K material, such as hafnium oxide (HfO). The gate insulating layer 122 can have a multi-layer structure.

The gate electrode 123 can be disposed on the gate insulating layer 122. The gate electrode 123 can overlap the channel region of the semiconductor pattern 121. For example, the source region and the drain region of the semiconductor pattern 121 can be disposed outside the gate electrode 123. The gate electrode 123 can include a conductive material. For example, the gate electrode 123 can include a metal, such as aluminum (Al), chromium (Cr), molybdenum (Mo), tungsten (W) and copper (Cu).

The interlayer insulating layer 124 can be disposed on the gate electrode 123. The interlayer insulating layer 124 can extend beyond the semiconductor pattern 121. For example, a side surface of the gate electrode 123 can be in direct contact with the interlayer insulating layer 124. The interlayer insulating layer 124 can include an insulating material. For example, the interlayer insulating layer 124 can include silicon oxide (SiO).

The source electrode 125 can be disposed on the interlayer insulating layer 124. The source electrode 125 can be electrically connected to the source region of the semiconductor pattern 121. For example, the gate insulating layer 122 and the interlayer insulating layer 124 can include a source contact hole partially exposing the source region of the semiconductor pattern 121. The source electrode 125 can be connected to the source region of the semiconductor pattern 121 through the source contact hole. For example, the source electrode 125 can include a portion overlapping with the source region of the semiconductor pattern 121. The source electrode 125 can include a conductive material. For example, the source electrode 125 can include a metal, such as aluminum (Al), chromium (Cr), copper (Cu), titanium (Ti), molybdenum (Mo) and tungsten (W). The source electrode 125 can include a material different from the gate electrode 123.

The drain electrode 126 can be disposed on the interlayer insulating layer 124. The drain electrode 126 can be electrically connected to the drain region of the semiconductor pattern 121. The drain electrode 126 can be spaced away from the source electrode 125. For example, the gate insulating layer 122 and the interlayer insulating layer 124 can include a drain contact hole partially exposing the drain region of the semiconductor pattern 121. The drain electrode 126 can be connected to the drain region of the semiconductor pattern 121 through the drain contact hole. For example, the drain electrode 126 can include a portion overlapping with the drain region of the semiconductor pattern 121. The drain electrode 126 can include a conductive material. For example, the drain electrode 126 can include a metal, such as aluminum (Al), chromium (Cr), copper (Cu), titanium (Ti), molybdenum (Mo) and tungsten (W). The drain electrode 126 can include the same material as the source electrode 125. For example, the drain electrode 126 can include a material different from the gate electrode 123.

The gate electrode of the first thin film transistor T1 can be electrically connected to the gate line GL. The gate electrode 123 of the second thin film transistor T2 can be electrically connected to the drain electrode of the first thin film transistor T1. The source electrode of the first thin film transistor T1 can be connected to the data line DL. The source electrode 125 of the second thin film transistor T2 can be connected to the power supply line VDD. The storage capacitor Cst can include a first capacitor electrode connected to the drain electrode of the first thin film transistor T1, and a second capacitor electrode connected to the drain electrode 126 of the second thin film transistor T2.

A device buffer layer 111 can be disposed between the device substrate 110 and the driving circuit. For example, the first thin film transistor T1, the second thin film transistor T2 and the storage capacitor Cst can be disposed on the device buffer layer 111. The device buffer layer 111 can prevent pollution from the device substrate 110 during a process of forming the driving circuit. The device buffer layer 111 can include an insulating material. For example, the device buffer layer 111 can include silicon oxide (SiO) and/or silicon nitride (SiN). The device buffer layer 111 can have a multi-layer structure. For example, the device buffer layer 111 can have a structure in which an insulating layer formed of silicon oxide (SiO) and an insulating layer formed of silicon nitride (SiN) are stacked.

An over-coat layer 112 can be disposed on the driving circuit. The over-coat layer 112 can remove a thickness difference due to the driving circuit. For example, the thickness difference due to the second thin film transistor T2 can be removed by the over-coat layer 112. A surface of the over-coat layer 112 opposite to the device substrate 110 can be a flat surface. The over-coat layer 112 can include an insulating material. The over-coat layer 112 can include a material having relatively high fluidity. For example, the over-coat layer 112 can include an organic insulating material.

The light-emitting device 130 can be disposed on the over-coat layer 112. The light-emitting device 130 can emit light displaying a specific color. For example, the light-emitting device 130 can include a first emission electrode 131, a light-emitting layer 132 and a second emission electrode 133, which are sequentially stacked on the over-coat layer 112.

The first emission electrode 131 can include a conductive material. The first emission electrode 131 can include a material having a relatively high reflectance. For example, the first emission electrode 131 can include a metal, such as aluminum (Al) and silver (Ag). The first emission electrode 131 can have a multi-layer structure. For example, the first emission electrode 131 can have a structure in which a reflective electrode formed of a metal is disposed between transparent electrodes formed of a transparent conductive material, such as ITO and IZO.

The light-emitting layer 132 can generate light having luminance corresponding to a voltage difference between the first emission electrode 131 and the second emission electrode 133. For example, the light-emitting layer 132 can be an emission material layer (EML) including an emission material. The emission material can include an organic material, an inorganic material or a hybrid material. For example, the display apparatus according to the embodiment of the present invention can be an organic light-emitting display apparatus having the light-emitting layer 132 of an organic material.

The second emission electrode 133 can include a conductive material. The second emission electrode 133 can include a material different from the first emission electrode 131. For example, the second emission electrode 133 can be a transparent electrode formed of a transparent conductive material, such as ITO and IZO. Thus, in the display apparatus according to the embodiment of the present invention, the light generated by the light-emitting layer 132 can be emitted to outside through the second emission electrode 133.

The light-emitting device 130 can further include an emitting function layer between the first emission electrode 131 and the light-emitting layer 132, and/or between the light-emitting layer 132 and the second emission electrode 133. The emitting function layer can include at least one of a hole injection layer (HIL), a hole transporting layer (HTL), an electron transporting layer (ETL), and an electrode injection layer (EIL). Thus, in the display apparatus according to the embodiment of the present invention, the emission efficiency of the light-emitting device 130 can be improved.

The light-emitting device 130 of each pixel region PA can be electrically connected to the driving circuit of the corresponding pixel region PA. For example, the over-coat layer 112 can include electrode contact holes partially exposing the second thin film transistor T2 of each driving circuit. The first emission electrode 131 of each pixel region PA can be electrically connected to the second thin film transistor T2 of the corresponding pixel region PA through the corresponding electrode contact hole. For example, the first emission electrode 131 of each light-emitting device 130 can be electrically connected to the drain electrode 126 of the corresponding second thin film transistor T2.

The light-emitting device 130 of each pixel region PA can be independently controlled from the light-emitting device 130 of adjacent pixel region PA. For example, the first emission electrode 131 of each pixel region PA can be insulated from the first emission electrode 131 of adjacent pixel region PA. The first emission electrode 131 of each pixel region PA can be spaced away from the first emission electrode 131 of adjacent pixel region PA. A bank insulating layer 113 can be disposed in a space between adjacent first emission electrodes 131. The bank insulating layer 113 can include an insulating material. For example, the bank insulating layer 113 can include an organic insulating material. The bank insulating layer 113 can be disposed on the over-coat layer 112. For example, the bank insulating layer 113 can be in direct contact with the over-coat layer 112 between adjacent first emission electrodes 131. The bank insulating layer 113 can include a material different from the over-coat layer 112. The bank insulating layer 113 can cover an edge of each first emission electrode 131. For example, the light-emitting layer 132 and the second emission electrode 133 of each pixel region PA can be stacked on a portion of the corresponding first emission electrode 131 exposed by the bank insulating layer 113.

The pixel regions PA can realize a different color from each other. For example, the light-emitting layer 132 of each pixel region PA can include a material different from the light-emitting layer 132 of adjacent pixel region PA. The light-emitting layer 132 of each pixel region PA can be spaced away from the light-emitting layer 132 of adjacent pixel region PA. For example, the light-emitting layer 132 of each pixel region PA can include an end on the bank insulating layer 113. The light-emitting layer 132 of each pixel region PA can be formed in different steps. For example, the light-emitting layer 132 of each pixel region PA can be formed by a deposition process using fine metal mask (FMM).

The second emission electrode 133 of each pixel region PA can be applied with the same voltage as the second emission electrode 133 of adjacent pixel region PA. For example, the second emission electrode 133 of each pixel region PA can be electrically connected to the second emission electrode 133 of adjacent pixel region PA. The second emission electrode 133 of each pixel region PA can include the same material as the second emission electrode 133 of adjacent pixel region PA. The second emission electrode 133 of each pixel region PA can be in contact with the second emission electrode 133 of adjacent pixel region PA. For example, the bank insulating layer 113 can be covered by the second emission electrode 133.

The light-emitting device 130 of each pixel region PA can have the same structure as the light-emitting device 130 of adjacent pixel region PA. For example, the light-emitting device 130 of each pixel region PA can include the emitting function layer same as the light-emitting device 130 of adjacent pixel region PA. The emitting function layer of each pixel region PA can be connected to the emitting function layer of adjacent pixel region PA. For example, in the display apparatus according to the embodiment of the present invention, at least one of the hole injection layer (HIL), the hole transporting layer (HTL), the electron transporting layer (ETL), and the electrode injection layer (EIL) can cover the bank insulating layer 113.

An encapsulating element 140 can be disposed on the light-emitting device 130 of each pixel region PA. The encapsulating element 140 can prevent damage of the light-emitting devices 130 due to the external impact and moisture. The encapsulating element 140 can extend outside the second emission electrode 133. For example, the over-coat layer 112, the bank insulating layer 113 and the light-emitting devices 130 can be covered by the encapsulating element 140.

The encapsulating element 140 can have a multi-layer structure. For example, the encapsulating element 140 can include a first encapsulating layer 141, a second encapsulating layer 142 and a third encapsulating layer 143, which are sequentially stacked on the second emission electrode 133. The first encapsulating layer 141, the second encapsulating layer 142 and the third encapsulating layer 143 can include an insulating material. The second encapsulating layer 142 can include a material different from the first encapsulating layer 141 and the third encapsulating layer 143. For example, the first encapsulating layer 141 and the third encapsulating layer 143 can include an inorganic insulating material, and the second encapsulating layer 142 can include an organic insulating material. Thus, in the display apparatus according to the embodiment of the present invention, the damage of the light-emitting devices 130 due to the external impact and moisture can be effectively prevented. The thickness difference due to the light-emitting devices 130 can be removed by the second encapsulating layer 142. For example, an upper surface of the encapsulating element 140 opposite to the device substrate 110 can be parallel with a surface of the device substrate 110.

Touch structures 310 and 320 can be disposed on the encapsulating element 140. The touch structures 310 and 320 can detect the touch of a user or tool. For example, each of the touch structures 310 and 320 can include touch electrodes 311 and 321, and bridge electrodes 312 and 322. Each of the bridge electrodes 312 and 322 can electrically connect adjacent touch electrodes 311 and 321. A touch buffer layer 200 can be disposed between the encapsulating element 140 and the touch structures 310 and 320. The touch buffer layer 200 can prevent the damage of the light-emitting devices 130 and the encapsulating element 140 due to a process of forming the touch structures 310 and 320. The touch buffer layer 200 can include an insulating material. For example, the touch buffer layer 200 can include silicon nitride (SiN) and/or silicon oxide (SiO).

The touch electrodes 311 and 321 can include a conductive material. The touch electrodes 311 and 321 can include a material having a relatively low resistance. For example, the touch electrodes 311 and 321 can include a metal, such as aluminum (Al), chromium (Cr), copper (Cu), Titanium (Ti), molybdenum (Mo) and tungsten (W).

The bridge electrodes 312 and 322 can include a conductive material. The bridge electrodes 312 and 322 can include a material having a relatively low resistance. For example, the bridge electrodes 312 and 322 can include a metal, such as aluminum (Al), chromium (Cr), copper (Cu), Titanium (Ti), molybdenum (Mo) and tungsten (W). The bridge electrodes 312 and 322 can include the same material as the touch electrodes 311 and 321.

The touch electrodes 311 and 321 and the bridge electrodes 312 and 322 can be disposed outside the light-emitting devices 130. The touch electrodes 311 and 321 and the bridge electrodes 312 and 322 can be spaced away from the light-emitting devices 130. For example, the touch electrodes 311 and 321, and the bridge electrodes 312 and 322 can overlap the bank insulating layer 113. Thus, in the display apparatus according to the embodiment of the present invention, the light emitted from the light-emitting devices 130 in a direction perpendicular to the surface of the device substrate 110 may not be blocked by the touch electrodes 311 and 321 and the bridge electrodes 312 and 322. And, in the display apparatus according to the embodiment of the present invention, the light emitted from the light-emitting device 130 of each pixel region PA in a direction toward adjacent pixel region PA can be blocked by the touch electrodes 311 and 321 and the bridge electrodes 312 and 322. Therefore, in the display apparatus according to the embodiment of the present invention, the quality deterioration of an image due to mixing of the light emitted from adjacent pixel region PA can be prevented.

The touch structures 310 and 320 can be composed of first touch structures 310 and second touch structures 320. Each of the first touch structures 310 can include first touch electrodes 311 and at least one first bridge electrode 312. The first touch electrodes 311 can be connected in a first direction by the first bridge electrode 321. Each of the second touch structures 320 can include second touch electrodes 321 and at least one second bridge electrode 322. The second touch electrodes 321 can be connected in a second direction perpendicular to the first direction by the second bridge electrode 322. The second touch electrodes 321 can be disposed side by side with the first touch electrodes 311. For example, the second touch electrodes 321 can be disposed on the same layer as the first touch electrodes 311. The second bridge electrode 322 can intersect the first bridge electrode 312. The second bridge electrode 322 can be insulated from the first bridge electrode 312. For example, the second bridge electrode 322 can be disposed on a layer different from the first bridge electrode 312.

A touch insulating layer 340 can be disposed between the first bridge electrode 312 and the second bridge electrode 322. The touch insulating layer 340 can include an insulating material. For example, the touch insulating layer 340 can include silicon oxide (SiO) or silicon nitride (SiN). The second bridge electrode 322 can be disposed between the touch buffer layer 200 and the touch insulating layer 340. The second touch electrodes 321 can be disposed on the touch insulating layer 340. For example, the first bridge electrode 312 can include the same material as the second touch electrodes 321. The second bridge electrode 322 can include a material different from the first bridge electrode 312. The touch insulating layer 340 can include touch contact holes exposing a portion of the second bridge electrode 322. The second touch electrodes 321 can be connected to the second bridge electrode 322 through the touch contact holes.

Touch cover layers 360 covering the first touch electrodes 311, the second touch electrodes 321 and the first bridge electrode 312 can be disposed on the touch insulating layer 340. Each of the touch cover layer 360 can cover one of the first touch electrodes 311, the second touch electrodes 321 and the first bridge electrode 312. For example, a side surface of each first touch electrode 311 can be in direct contact with one of the touch cover layers 360. The touch cover layers 360 can include a material having a relatively higher corrosion resistance than the first touch electrodes 311, the second touch electrodes 321 and the first bridge electrode 312. For example, the touch cover layers 360 can include titanium (Ti). Thus, in the display apparatus according to the embodiment of the present invention, the damage of the first touch electrodes 311, the second touch electrodes 321 and the first bridge electrode 312 due to the subsequent process can be prevented.

A black matrix 410 can be disposed on the touch structures 310 and 320. The black matrix 410 can be disposed outside the light-emitting devices 130. The black matrix 410 can overlap the touch structures 310 and 320. For example, the black matrix 410 can be disposed between the pixel regions PA. The black matrix 410 can overlap the bank insulating layer 113. For example, the touch structures 310 and 320 can be disposed between the touch buffer layer 200 and the black matrix 410. The black matrix 410 can cover the touch structures 310 and 320.

The black matrix 410 can be disposed between color filters 420. Each of the color filters 420 can overlap one of the light-emitting devices 130. For example, the color filters 420 can overlap the pixel regions PA. Each of the color filters 420 can realize the same color as the corresponding light-emitting device 130. Thus, in the display apparatus according to the embodiment of the present invention, the purity of the color realized by each pixel region PA can be improved. A cover passivation layer 500 and a cover substrate 600 can be sequentially stacked on the black matrix 410 and the color filters 420.

The encapsulating element 140 can extend on the non-display area NA of the device substrate 110. Pads 104 and 304 can be disposed on the non-display area NA of the device substrate 110. The pads 104 and 304 can be spaced away from the encapsulating element 140. For example, the pads 104 and 304 can be disposed outside the encapsulating element 140. At least one dam 106 can be disposed between the encapsulating element 140 and the pads 104 and 304. The dam 106 can block the flow of the second encapsulating layer 142 having relatively high fluidity. For example, the dam 106 can define a region which is covered by the second encapsulating layer 142. The dam 106 can extend along an edge of the device substrate 110. The dam 106 can include an insulating material. The dam 106 can include the same material as one of insulating layers formed between the device substrate 110 and the light-emitting devices 130. For example, the dam 106 can be formed simultaneously with the over-coat layer 112.

The pads 104 and 304 can be composed of display pads 104 and touch pads 304. Each of the display pads 104 can be electrically connected to one of the signal lines GL, DL and VDD. The display pads 104 can include a conductive material. The display pads 104 can include the same material as one of the electrodes constituting the driving circuits. For example, the display pads 104 can be formed simultaneously with the source electrode 125 and the drain electrode 126 of the second thin film transistor T2.

Each of the touch pads 304 can be electrically connected to one of the touch structures 310 and 320. For example, each of the touch structures 310 and 320 can be electrically connected to the corresponding touch pad 304 by one of touch routing lines 330 which extend along a surface of the encapsulating element 140. Each of the touch routing lines 330 can have a multi-layer structure. For example, each of the touch routing lines 330 can include a lower routing electrode layer 331, an upper routing electrode layer 332 and a routing cover layer 333.

The lower routing electrode layer 331 can include the same material as the second bridge electrode 322. For example, the lower routing electrode layer 331 can be disposed between the touch buffer layer 200 and the touch insulating layer 340. The upper routing electrode layer 332 can include the same material as the second touch electrodes 321. For example, the upper routing electrode layer 332 can be disposed on the touch insulating layer 340. The upper routing electrode layer 332 can be electrically connected to the lower routing electrode layer 331. For example, the touch insulating layer 340 can include at least one routing contact hole 340h partially exposing the lower routing electrode layer 331. The upper routing electrode layer 332 can be in direct contact with the lower routing electrode layer 331 in the routing contact hole 340h. Thus, in the display apparatus according to the embodiment of the present invention, the disconnection of the touch routing lines 330 due to the external impact can be prevented.

The routing cover layer 333 can be disposed on the upper routing electrode layer 332. The routing cover layer 333 can extend on a side surface of the upper routing electrode layer 332. For example, the upper routing electrode layer 332 can be covered by the routing cover layer 333. The routing cover layer 333 can include the same material as the touch cover layer 360. For example, the routing cover layer 333 can include a metal having a relatively high corrosion resistance, such as titanium (Ti). Thus, in the display apparatus according to the embodiment of the present invention, the damage of the touch routing lines 330 due to the subsequent process can be prevented.

Each of the touch pads 304 can have a multi-layer structure. For example, each of the touch pads 304 can have a structure in which a pad electrode layer 304p and a pad cover layer 304t are stacked. The pad electrode layer 304p can be formed simultaneously with the touch structures 310 and 320. For example, the pad electrode layer 304p can include the same material as the second touch electrodes 321. The pad electrode layer 304p can include the same material as the upper routing electrode layer 332. The pad cover layer 304t can be disposed on the pad electrode layer 304p. The pad cover layer 304t can extend on a side surface of the pad electrode layer 304p. For example, the pad electrode layer 304p can be covered by the pad cover layer 304t. The pad cover layer 304t can have a material having a relatively high corrosion resistance. For example, the pad cover layer 304t can include a metal, such as titanium (Ti). The pad cover layer 304t can include the same material as the routing cover layer 333. Thus, in the display apparatus according to the embodiment of the present invention, the damage of the pad electrode layer 304p due to the subsequent process can be prevented.

A bending area BA can be disposed between the touch routing lines 330 and the pads 104 and 304. Connecting lines 112 and a crack preventing layer 108 can be stacked on the bending area BA. Each of the connecting lines 112 can intersect the bending area BA. For example, each of the touch routing lines 330 can be electrically connected to the corresponding touch pad 304 by one of the connecting lines 112. The crack preventing layer 108 can expose both ends of each connecting line 112. The touch routing lines 330 and the touch pads 304 can be connected to each other by the ends of the connecting lines 112 exposed by the crack preventing layer 108. For example, each of the touch routing lines 330 and the touch pads 304 can include an end on the crack preventing layer 108. The end of each touch routing line 330 on the crack preventing layer 108 can be covered by the routing cover layer 333 of the corresponding touch routing line 330. The end of each touch pad 304 on the crack preventing layer 108 can be covered by the pad cover layer 304t of the corresponding touch pad 304. Thus, in the display apparatus according to the embodiment of the present invention, the touch routing lines 330 and the touch pads 304 which are electrically connected by the connecting lines 330 may not be damaged by the subsequent process.

Figure 4:
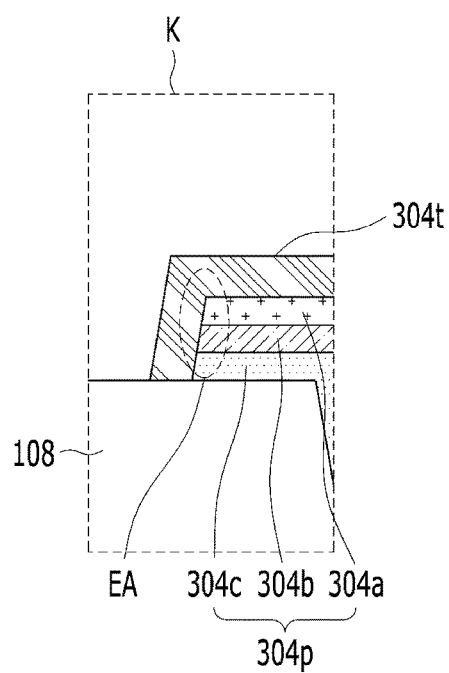
FIG. 4 is an enlarged view of K region in FIG. 3.

The display apparatus according to the embodiment of the present invention is described that the pad electrode layer 304p is a single layer. However, the display apparatus according to another embodiment of the present invention can include the pad electrode layer 304p having a multi-layer structure. For example, in the display apparatus according to another embodiment of the present invention, the pad electrode layer 304p can have a stacked structure of a first pad layer 304a, a second pad layer 304b and a third pad layer 304c, as shown in FIG. 4. An end side EA of the pad electrode layer 304p can be covered by the pad cover layer 304t. For example, an end side of the first pad layer 304a, an end side of the second pad layer 304b, and an end side of the third pad layer 304c can be in contact with the pad cover layer 304t. Thus, in the display apparatus according to another embodiment of the present invention, a material of the first pad layer 304a, a material of the second pad layer 304b, and a material of the third pad layer 304c can be selected regardless of the subsequent process. For example, in the display apparatus according to another embodiment of the present invention, the degree of freedom for the stacked structure and the material of the pad electrode layer 304p can be improved.

FIGS. 5A to 5F are views sequentially showing a method of forming the display apparatus according to an embodiment of the present invention.

The method of forming the display apparatus according to the embodiment of the present invention will be described with reference to FIGS. 1 to 3 and 5A to 5F.

Figure 5A:
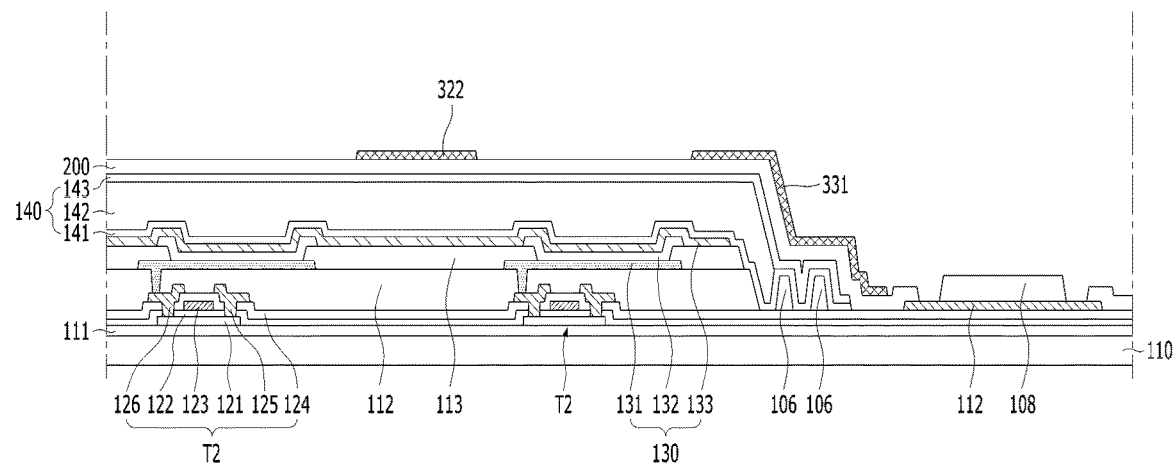
FIGS. 5A to 5F are views sequentially showing a method of forming the display apparatus according to the embodiment of the present invention.

First, as shown in FIGS. 2 and 5A, the method of forming the display apparatus according to the embodiment of the present invention can include a step of forming driving circuits and light-emitting devices 130 on a device substrate 110, a step of forming an encapsulating element 140 covering the light-emitting devices 130, a step of forming connecting lines 112 at the outside of the encapsulating element 140, a step of forming a crack preventing layer 108 on the connecting lines 112, a step of forming a touch buffer layer 200 on the encapsulating element 140, and a step of forming at least one second bridge electrode 322 and lower routing electrode layers 331 on the touch buffer layer 200. Each of the driving circuits can include a second thin film transistor T2. Each of the light-emitting devices 130 can be electrically connected to one of the driving circuits.

The step of forming the encapsulating element 140 can include a step of forming at least one dam 106 surrounding a display area AA, and a step of sequentially stacking a first encapsulating layer 141, a second encapsulating layer 142 and a third encapsulating layer 142 on the device substrate 110 in which the dam 106 is formed.

The step of forming the touch buffer layer 200 can include a step of covering an edge of each connecting line 112 with the touch buffer layer 200. The touch buffer layer 200 can be spaced away from the crack preventing layer 108. Thus, in the method of forming the display apparatus according to the embodiment of the present invention, each of the connecting lines 112 can be electrically connected to the corresponding touch routing line 330 and the corresponding touch pad 304 by the subsequent process. The crack preventing layer 108 can be formed to overlap the bending area BA.

Figure 5B:
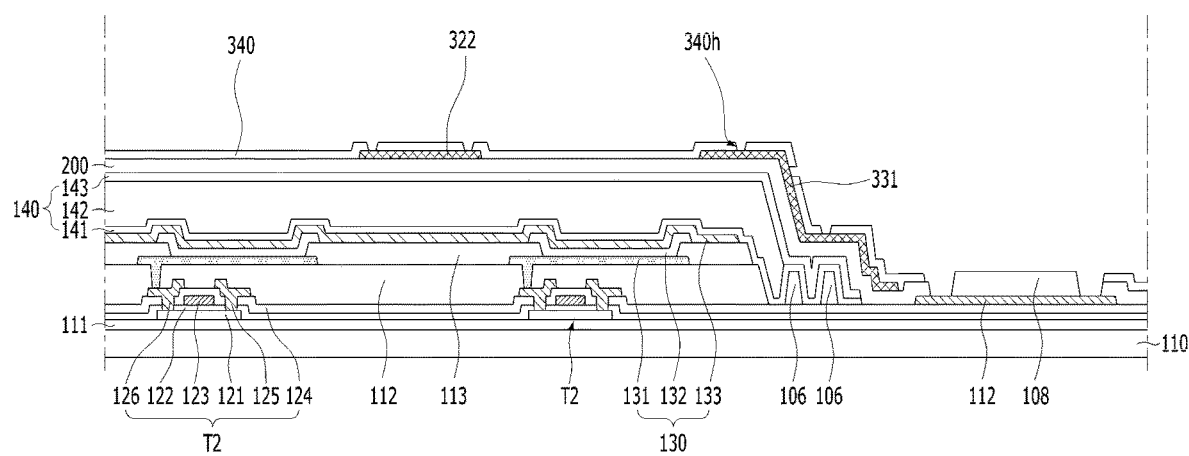

As shown in FIGS. 2 and 5B, the method of forming the display apparatus according to the embodiment of the present invention can include a step of forming a touch insulating layer 340 on the device substrate 110 in which the second bridge electrode 332 and the lower routing electrode layers 331 are formed, and a step of exposing a portion of the second bridge electrode 322, a portion of each lower routing electrode layer 331 and a portion of each connecting line 112 by a partially etching process of the touch insulating layer 340.

The step of exposing the portion of the second bridge electrode 322 can include a step of partially exposing two opposite ends of the second bridge electrode 322. The step of exposing the portion of each lower routing electrode layer 331 can include a step of forming at least one routing contact hole 340h in the touch insulating layer 340. The step of exposing the portion of each connecting line 112 can include a step of forming an end of the touch insulating layer 340 on the touch buffer layer 200.

Figure 5C:
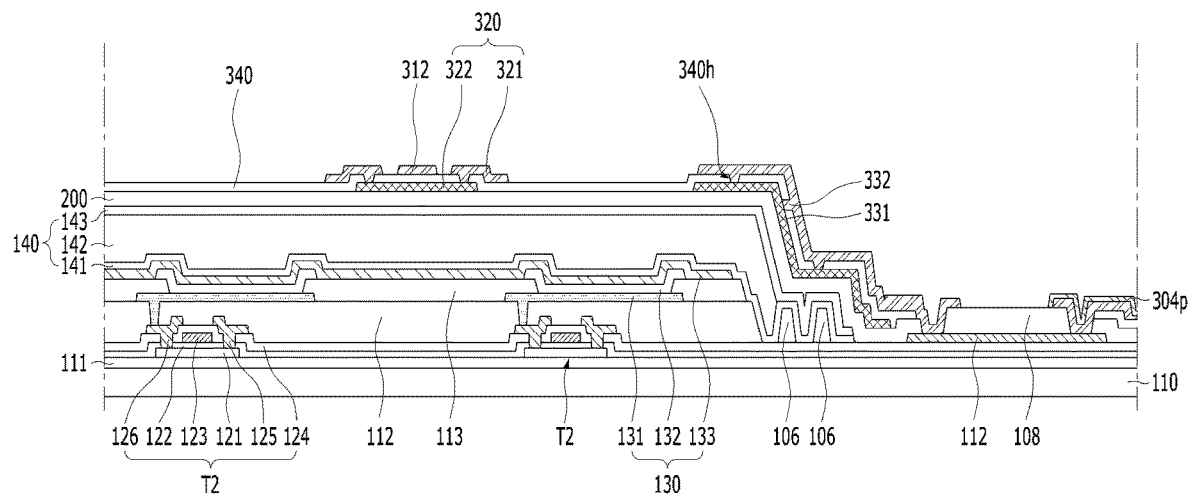

As shown in FIGS. 2 and 5C, the method of forming the display apparatus according to the embodiment of the present invention can include a step of forming first touch electrodes 311, second touch electrodes 321, a first bridge electrode 312, upper routing electrode layers 332 and pad electrode layers 304p on the touch insulating layer 340.

The step of forming the second touch electrodes 321 can include a step of connecting each of the second touch electrodes 321 to the corresponding second bridge electrode 322 via the portion of each second bridge electrode exposed by the touch insulating layer 340. The step of forming the upper routing electrode layer 332 can include a step of connecting each upper routing electrode layer 332 to the corresponding lower routing electrode layer 322 via the routing contact hole 340h, and a step of connecting each upper routing electrode layer 332 to the corresponding connecting line 112. The step of forming the pad electrode layers 304p can include a step of each pad electrode layer 304p to the corresponding connecting line 112. An end of each upper routing electrode layer 332 and an end of the pad electrode layer 304p can be formed on the crack preventing layer 108.

Figure 5D:
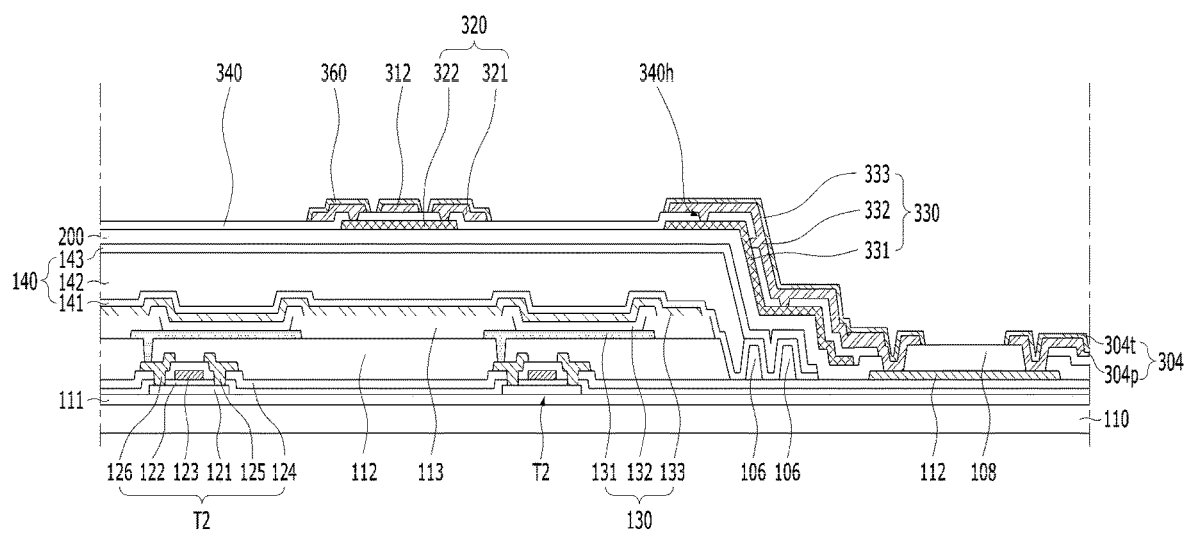

As shown in FIGS. 2 and 5D, the method of forming the display apparatus according to the embodiment of the present invention can include a step of forming touch cover layers 360, routing cover layers 333 and pad cover layers 304t. Each of the first touch electrodes 311, the first bridge electrode 312 and each of the second touch electrodes 321 can be covered by one of the touch cover layers 360. Each of the upper routing electrode layers 332 can be covered by one of the routing cover layers 333. Each of the pad electrode layers 304p can be covered by one of the pad cover layers 304t.

Each of the touch cover layers 360 can extend on a side surface of the corresponding first touch electrode 311, a side surface of the first bridge electrode 312 or a side surface of the corresponding second touch electrode 321. For example, the first touch electrodes 311, the first bridge electrode 312 and the second touch electrodes 321 can respectively include the side surface covered by the corresponding touch cover layer 360.

Each of the routing cover layers 333 can extend on a side surface of the corresponding upper routing electrode layer 332. For example, an end of each upper routing electrode layer 332 on the crack preventing layer 108 can be covered by the corresponding routing cover layer 333. Each of the lower routing electrode layer 331, each of the upper routing electrode layer 332 and each of the routing cover layer 333 can constitute a touch routing line 330.

Each of the pad cover layer 304t can extend on a side surface of the corresponding pad electrode layer 304p. For example, an end of each pad electrode layer 304p on the crack preventing layer 108 can be covered by the corresponding pad cover layer 304t. Each of the pad electrode layers 304p and each of the pad cover layers 304t can constitute a touch pad 304.

Figure 5E:
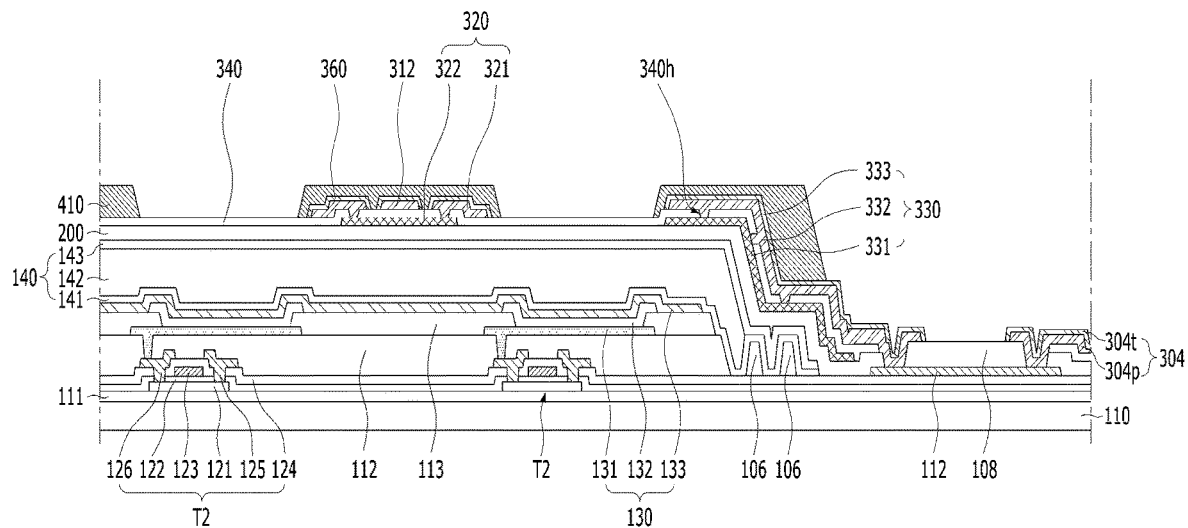

As shown in FIGS. 2 and 5E, the method of forming the display apparatus according to the embodiment of the present invention can include a step of forming a black matrix 410 on the device substrate 110 in which the touch cover layers 360, the routing cover layers 333 and the pad cover layers 304t are formed.

The black matrix 410 can overlap a bank insulating layer 113. The black matrix 410 can expose the crack preventing layer 108. For example, an end of each touch routing line 330 and an end of each touch pad 304 which are disposed on the crack preventing layer 108 can be exposed by the black matrix 410.

The step of forming the black matrix 410 can include a step of forming a dye layer for forming the black matrix 410 on the device substrate 110 in which the touch cover layers 360, the routing cover layers 333 and the pad cover layers 304t are formed, and a step of patterning the dye layer. The patterning process of the dye layer can be a wet etching process. For example, the end of each touch routing line 330 and the end of each touch pad 304 which are exposed by the black matrix 410 can be exposed to an etchant used in the wet etching process.

The routing cover layer 333 of each touch routing line 330 and the pad cover layer 304t of each touch pad 304 can have an etch selectivity with the black matrix 410. For example, the routing cover layer 333 and the pad cover layer 304t can be formed of a material that does not react with an etchant used in the etching process of the black matrix 410. Thus, in the method of forming the display apparatus according to the embodiment of the present invention, the upper routing electrode layers 332 and the pad electrode layers 304p may not be damaged by the subsequent etching process for forming the black matrix 410.

Figure 5F:
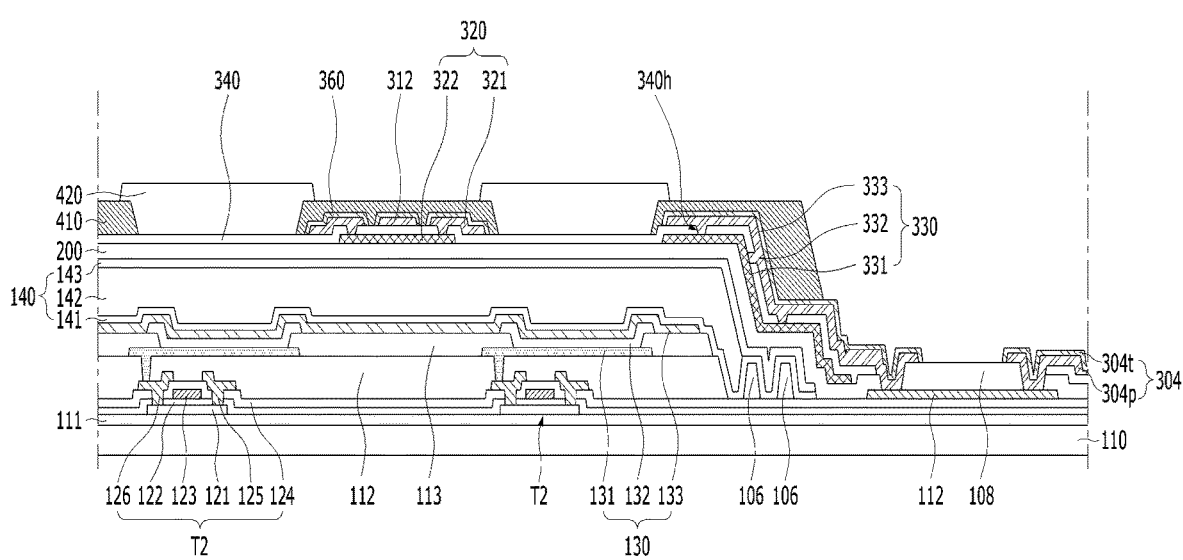

As shown in FIGS. 2 and 5F, the method of forming the display apparatus according to the embodiment of the present invention can include a step of forming color filters 420 in a space defined by the black matrix 410.

The step of forming the color filters 420 can include a step of forming a dye layer for forming the color filters 420 on the device substrate 110 in which the black matrix 410 is formed, and a step of patterning the dye layer. The routing cover layer 333 of each touch routing line 330 and the pad cover layer 304t of each touch pad 304 can have an etch selectivity with the color filters 420. For example, the routing cover layer 333 and the pad cover layer 304t can be formed of a material that does not react with an etchant used in the etching process of the color filters 420. Thus, in the method of forming the display apparatus according to the embodiment of the present invention, the upper routing electrode layers 332 and the pad electrode layers 304p may be not damaged by the subsequent etching process for forming the color filters 420.

As shown in FIGS. 2 and 3, the method of forming the display apparatus according to the embodiment of the present invention can include a step of sequentially stacking a cover passivation layer 500 and a cover substrate 600 on the device substrate 110 in which the black matrix 410 and the color filters 420 are formed.

Accordingly, the display apparatus according to the embodiment of the present invention and the method of forming the same can prevent the damage of the upper routing electrode layers 332 and the pad electrode layers 304p due to the etching process for forming the black matrix 410 and/or the color filters 420 on the encapsulating element 140 by forming the routing cover layers 333 covering the side surface of each upper routing electrode layer 332 and the pad cover layers 304t covering the side surface of each pad electrode layer 304p. Thereby, in the display apparatus according to the embodiment of the present invention and the method of forming the same, the reliability of the signal transmitted through the touch pads 304 can be improved.

The display apparatus according to the embodiment of the present invention is described that the touch structures 310 and 320 can be disposed on the encapsulating element 140, and the touch pad 304 can have a stacked structure of the pad electrode layer 304p and the pad cover layer 304t. However, in the display apparatus according to another embodiment of the present invention, the black matrix 410 and/or the color filters 420 can be in direct contact with the encapsulating element 140, as shown in FIG. 6.

Figure 6:
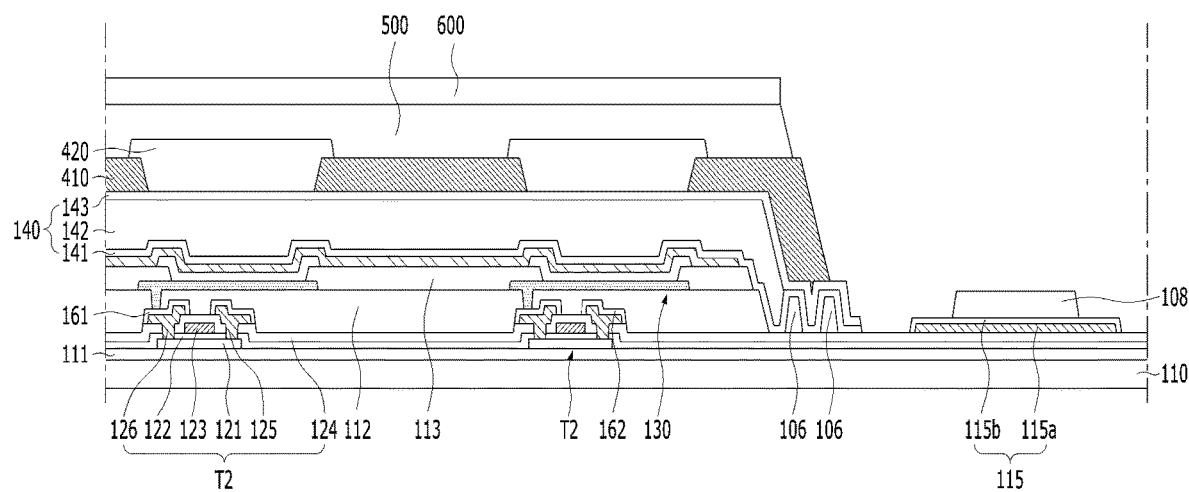
FIG. 6 is a view showing the display apparatus according to another embodiment of the present invention.

Referring to FIG. 6, a display pad 115 can be disposed outside the encapsulating element 140. The display pad 115 can include a region overlapping with the crack preventing layer 108. For example, the display pad 115 can extend between the interlayer insulating layer 124 and the crack preventing layer 108.

The display pad 115 can include a pad conductive layer 115a and a pad cover layer 115b. The pad cover layer 115b can extend a side surface of the pad conductive layer 115a. For example, the pad cover layer 115b can cover an end of the pad conductive layer 115a exposed by the crack preventing layer 108. Thus, in the display apparatus according to another embodiment of the present invention, the damage of the display pad 115 due to the formation process of the black matrix 410 and/or the color filters 420 can be prevented. For example, the pad cover layer 115b can have an etch selectivity with the black matrix 410 and the color filters 420. Therefore, the end of the pad conductive layer 115a exposed by the crack preventing layer 108 may be not damaged by the formation process of the black matrix 410 and the color filters 420. Thereby, in the display apparatus according to another embodiment of the present invention, the transmission of the external signal through the display pad 115 can be effectively performed.

Figure 7A:
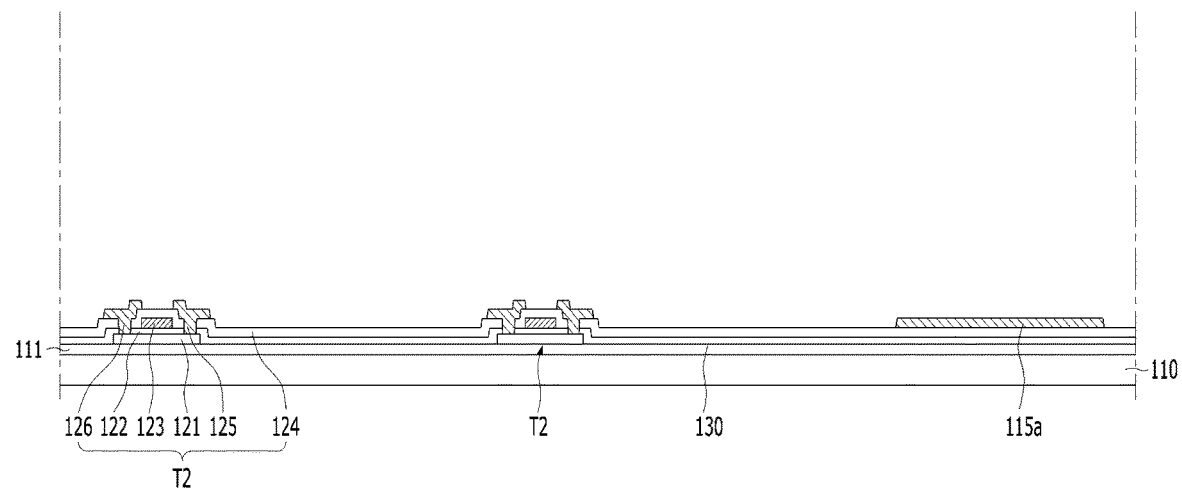
FIGS. 7A and 7B are views sequentially showing a method of forming the display apparatus according to another embodiment of the present invention.
Figure 7B:
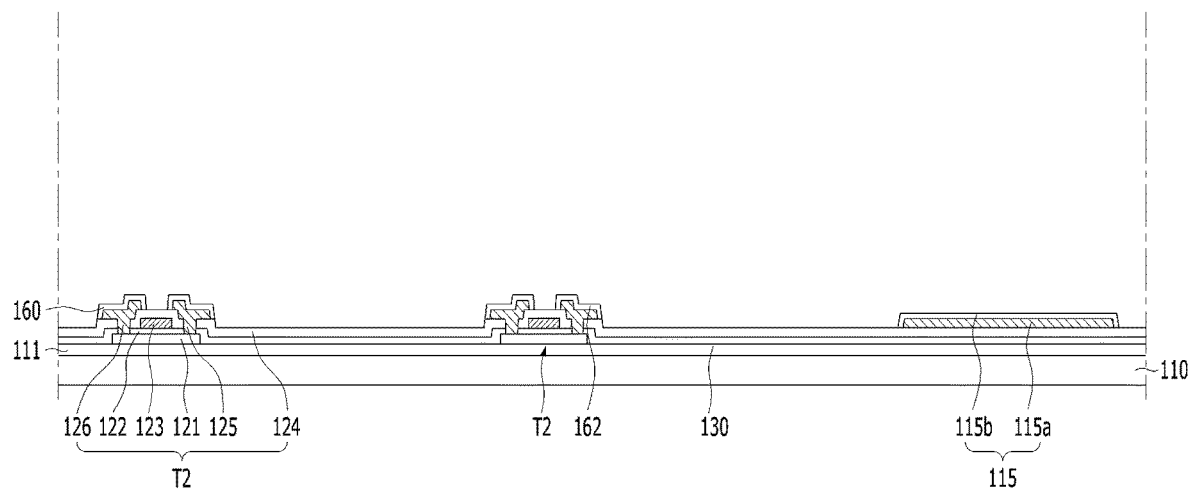

FIGS. 7A and 7B are views sequentially showing a method of forming the display apparatus according to another embodiment of the present invention.

The method of forming the display apparatus according to another embodiment of the present invention will be described with reference to FIGS. 6, 7A and 7B.

First, as shown in FIG. 7A, the method of forming the display apparatus according to another embodiment of the present invention can include a step of forming a second thin film transistor T2 on a device substrate 110, and a step of forming a pad electrode layer 115a on the device substrate 110.

As shown in FIG. 7B, the method of forming the display apparatus according to another embodiment of the present invention can include a step of forming a first electrode cover layer 161, a second electrode cover layer 162 and a pad cover layer 115b on the device substrate 110 in which the second thin film transistor T2 and the pad electrode layer 115a are formed.

The step of forming the first electrode cover layer 161, the second electrode cover layer 162 and the pad cover layer 115b can include a step of forming a cover electrode material layer on the device substrate 110 in which the second thin film transistor T2 and the pad electrode layer 115a are formed, and a step of patterning the cover electrode material layer. The first electrode cover layer 161 can cover a source electrode 125 of the second thin film transistor T2. For example, the first electrode cover layer 161 can extend on a side surface of the source electrode 125. The second electrode cover layer 162 can cover a drain electrode 126 of the second thin film transistor T2. For example, the second electrode cover layer 162 can extend on a side surface of the drain electrode 126. The pad cover layer 115b can cover the pad electrode layer 115a. For example, the pad cover layer 115b can extend on a side surface of the pad electrode layer 115a.

Accordingly, in the display apparatus according to another embodiment of the present invention and the method for forming the same, the damage of the pad electrode layer 115a, the source electrode 125 and the drain electrode 126 due to the subsequent etching process can be prevented by a step of simultaneously forming the pad electrode layer 115a with the source electrode 125 and the drain electrode 126 of the second thin film transistor T2, and a step of simultaneously forming the first electrode cover layer 161 covering the source electrode 125 and the second electrode cover layer 162 covering the drain electrode 126 with the pad cover layer 115b covering the pad electrode layer 115a. Thus, in the display apparatus according to another embodiment of the present invention and the method of forming the same, the reliability of the driving circuits can be increased, and the degree of freedom for the subsequent process of the pad can be improved.

As a result, the display apparatus according to the embodiments of the present invention can include the light-emitting device and the encapsulating element which are disposed on the display area of the device substrate, and the pad electrode layer and the pad cover layer which are stacked on the non-display area of the device substrate, wherein the pad cover layer can cover the side surface of the pad electrode layer.

Thus, in the display apparatus according to the embodiments of the present invention, the damage of the pad electrode layer due to the process of forming the black matrix and/or the color filters performed after the formation of the pad can be prevented. Thereby, in the display apparatus according to the embodiments of the present invention, the reliability of the signal transmitting through the pad can be improved.

What is claimed is:
1. A display apparatus comprising:
   a device substrate including a display area and a non-display area;
   a light-emitting device on the display area of the device substrate;
   a pad on the non-display area of the device substrate, the pad having a stacked structure composed of a pad electrode layer and a pad cover layer;
   an encapsulating element covering the light-emitting device, the encapsulating element being spaced away from the pad;
   a touch structure on the encapsulating element, the touch structure including touch electrodes and bridge electrodes, the touch electrodes and the bridge electrodes being disposed outside the light-emitting device;
   a touch routing line extending along a surface of the encapsulating element to electrically connect the touch structure to the pad, the touch routing line having a stacked structure of an upper routing electrode layer and a routing cover layer;
a touch insulated layer on the encapsulating element;
a color filter on the touch structure, the color filter overlapping with the light-emitting device; and
a black matrix disposed side by side with the color filter and on a same layer as the color filter, the black matrix covering the touch electrodes, the bridge electrodes and a portion of the touch routing line,
wherein the pad cover layer fully covers an outermost side surface of the pad electrode layer,
wherein a side surface of the upper routing electrode layer is covered by the routing cover layer,
wherein the pad cover layer and the routing cover layer have an etch selectivity with the black matrix and the color filter,
wherein the touch electrodes of the touch structure and the upper routing electrode layer of the touch routing line are disposed on the touch insulating layer,
wherein the touch routing line includes a lower routing electrode layer between the encapsulating element and the touch insulating layer, and
wherein the upper routing electrode layer is electrically connected to the lower routing electrode layer.

2. The display apparatus according to claim 1, further comprising touch cover layers on the touch structure, each of the touch cover layers covering one of the touch electrodes and the bridge electrodes,
wherein the black matrix is in contact with the touch cover layers and a portion of the routing cover layer.

3. The display apparatus according to claim 2, wherein the touch cover layers include a same material as the routing cover layer.

4. The display apparatus according to claim 1, wherein the pad cover layer includes titanium (Ti).

5. The display apparatus according to claim 1, further comprising:
a thin film transistor between the display area of the device substrate and the light-emitting device;
a first electrode cover layer covering a source electrode of the thin film transistor; and
a second electrode cover layer covering a drain electrode of the thin film transistor.

6. The display apparatus according to claim 5, wherein the first electrode cover layer extends on a side surface of the source electrode of the thin film transistor, and the second electrode cover layer extends on a side surface of the drain electrode of the thin film transistor.

7. The display apparatus according to claim 5, wherein the second electrode cover layer includes a same material as the first electrode cover layer.

8. The display apparatus according to claim 7, wherein the first electrode cover layer includes a same material as the pad cover layer.

9. The display apparatus according to claim 7, wherein the pad electrode layer includes a same material as the source electrode and the drain electrode.

10. The display apparatus according to claim 1, wherein the pad electrode layer has a multi-layer structure.

11. The display apparatus according to claim 1, wherein the upper routing electrode layer of the touch routing line includes a same material as the touch electrodes of the touch structure.

12. The display apparatus according to claim 1, wherein the routing cover layer of the touch routing line includes a same material as the pad cover layer.

13. The display apparatus according to claim 12, wherein the pad electrode layer includes a same material as the upper routing electrode layer of the touch routing line.

14. The display apparatus according to claim 1, further comprising:
a connecting line intersecting a bending area which is disposed within the non-display area of the device substrate; and
a crack preventing layer on the connecting line, the crack preventing layer overlapping with the bending area,
wherein the touch routing line is connected to the pad by the connecting line, and
wherein each of the touch routing line and the pad includes an end disposed on the crack preventing layer.

15. The display apparatus according to claim 14, wherein the touch routing line overlaps with a first end of the connecting line and the pad overlaps with a second end of the connecting line opposite to the first end.

16. The display apparatus according to claim 14, wherein the connecting line is disposed under the crack preventing layer.

17. A display apparatus comprising:
a device substrate including a display area and a non-display area;
a light-emitting device on the display area of the device substrate;
a pad on the non-display area of the device substrate, the pad having a stacked structure composed of a pad electrode layer and a pad cover layer;
an encapsulating element covering the light-emitting device, the encapsulating element being spaced away from the pad;
a touch insulating layer on the encapsulating element;
a touch structure on the encapsulating element, the touch structure including touch electrodes on the touch insulating layer;
a touch routing line connecting the touch structure to the pad, the touch routing line including a lower routing electrode layer between the encapsulating element and the touch insulating layer, an upper routing electrode layer on the touch insulating layer and a routing cover layer covering the upper routing electrode; and
a black matrix and a color filter on the touch structure the color filter overlapping with the light-emitting device, the black matrix being disposed side by side with the color filter,
wherein the pad cover layer fully covers an outermost side surface of the pad electrode layer,
wherein the black matrix covers the touch electrodes of the touch structure and a portion of the touch routing line,
wherein the pad cover layer and the routing cover layer have an etch selectivity with the black matrix and the color filter, and
wherein the upper routing electrode layer is electrically connected to the lower routing electrode layer.

18. The display apparatus according to claim 17, wherein a first portion of the black matrix is disposed between two adjacent color filters, and the first portion of the black matrix covers opposite sides of the touch structure, and
wherein the touch routing line is disposed between an outermost edge of the encapsulating element and a second portion of the black matrix.

19. The display apparatus according to claim 1, wherein the pad cover layer covers opposite sides of the pad electrode layer.

* * * * *